(12) United States Patent
Lin et al.

(10) Patent No.: US 8,872,032 B2
(45) Date of Patent: Oct. 28, 2014

(54) BUNDLED FLEXIBLE FLAT CIRCUIT CABLE

(75) Inventors: Gwun-Jin Lin, Taoyuan County (TW); Chih-Heng Chuo, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 35 days.

(21) Appl. No.: 13/602,646

(22) Filed: Sep. 4, 2012

(65) Prior Publication Data

US 2012/0325527 A1 Dec. 27, 2012

Related U.S. Application Data

(62) Division of application No. 12/729,677, filed on Mar. 23, 2010, now abandoned.

(30) Foreign Application Priority Data

Sep. 18, 2009 (TW) ................................ 98131522 A (51) Int. Cl.
*H01B 7/08* (2006.01)
*H05K 1/02* (2006.01)
*H05K 1/18* (2006.01)
*H05K 1/14* (2006.01)

(52) U.S. Cl.
CPC .......... *H05K 1/028* (2013.01); *H05K 2201/055* (2013.01); *H01B 7/0892* (2013.01); *H05K 2201/051* (2013.01); *H05K 1/189* (2013.01); *H05K 1/0218* (2013.01); *H05K 1/148* (2013.01)
USPC ...................................... 174/117 F; 174/262

(58) Field of Classification Search
CPC ... H01B 7/0892; H05K 1/0218; H05K 1/028; H05K 1/148; H05K 1/189; H05K 2201/051; H05K 2201/055
USPC ............ 174/36, 110 R, 117 F, 117 FF, 133 R, 174/262–268; 361/749–752, 777, 780; 439/67, 77, 86, 493–502
See application file for complete search history.

(56) References Cited

U.S. PATENT DOCUMENTS

| | | | | |
|---|---|---|---|---|
| 5,322,974 | A | * | 6/1994 | Walston ........................ 174/250 |
| 6,700,075 | B2 | * | 3/2004 | Gordon ........................ 174/261 |
| 7,180,001 | B1 | * | 2/2007 | Lin et al. ..................... 174/117 F |
| 2002/0046868 | A1 | * | 4/2002 | Borg et al. ................. 174/113 R |
| 2006/0042820 | A1 | * | 3/2006 | Lin et al. ..................... 174/117 F |
| 2009/0188716 | A1 | * | 7/2009 | Nagase ........................ 174/72 A |

* cited by examiner

*Primary Examiner* — Yuriy Semenenko
(74) *Attorney, Agent, or Firm* — Rosenberg, Klein & Lee (57) ABSTRACT

A bundled flexible flat circuit cable includes a flexible substrate that forms at least one cluster section having an end forming at least one first connection section and an opposite end forming at least one second connection section. Both the first and second connection sections or one of the first and second connection sections form a stack structure. The flexible substrate can be of a structure of single-sided or double-sided substrate and may additionally include an electromagnetic shielding layer. A bundling structure is provided to bundle the cluster section at a predetermined location to form a bundled structure. The bundling structure can be made of a shielding material, an insulation material, or a combination of shielding material and insulation material.

7 Claims, 7 Drawing Sheets

BUNDLED FLEXIBLE FLAT CIRCUIT CABLE

RELATED APPLICATIONS

This application is a Divisional patent application of co-pending application Ser. No. 12/729,677, filed on 23 Mar. 2010, now pending. The entire disclosure of the prior application, Ser. No. 12/729,677, from which an oath or declaration is supplied, is considered a part of the disclosure of the accompanying Divisional application and is hereby incorporated by reference.

FIELD OF THE INVENTION

The present invention relates to a single transmission flat cable, and in particular to a bundled flexible flat circuit cable with a stack structure.

BACKGROUND OF THE INVENTION

A conventional flat cable comprises a plurality of conductors covered with insulation arranged to joint each other in a side-by-side fashion to form a cable having a flat structure. The flat cable is commonly used for transmission of signal in a variety of electrical appliances, electronic facility, computer facility, and communication facility.

Recently, flexible circuit board technology has also been applied to construct flat cables. The flexible circuit-board flat cables that are commonly used currently are constructed in different configurations that are either a single-sided board, a double-sided board, or a multiple-layered board, in order to meet the needs of applications that require different numbers of conductors for signal transmission.

Adopting a flat cable that has a flat structure to serve as a signal transmission line constitutes no severe problem in practical applications where the flat cable needs to extend through an elongate space. However, lots of existing electronic or communication devices use a hinge structure that has a bore. For example, in the structure designs of various consumer electronic devices, such as notebook computers, liquid crystal displays, digital cameras, mobile phones, touch panels, or other electronic devices, a cover or a screen is coupled to a body of the electronic device with a hinge structure. To allow a signal to be transmitted from the body of the electronic device to the cover or the screen, the state-of-the-art techniques use a miniaturized flat cable or bundled extra thin leads to serve as a signal transmission line. In the applications mentioned previously, adopting the conventional flat cable constitutes problems, for example, rotation of the hinge being negatively affected by the existence of the conventional flat cable, insufficient flexibility of the conductors or leads, poor durability against flexing of the conductors or leads. Due to these problems, the present inventor provided various flexible flat circuit cables that have a bundled structure and a cluster section. The cluster section is composed of a plurality of cluster strips formed by slitting a flexible substrate in an extension direction.

SUMMARY OF THE INVENTION

Using a flexible flat circuit cable having a bundled structure and a cluster section meets most of the needs discussed above. However, certain problems exist. For example, in an attempt to set a flexible flat circuit cable in a hinge of an electronic device, extending a connection socket or a terminal plug provided at an end of the flat cable through the small diameter of the bore of the hinge becomes a problem that is hard to handle. Further, even though the connection socket or the terminal plug can readily extend through the small diameter of the hinge bore, the cluster of strips is susceptible to arbitrary distortion and external electromagnetic interference.

In view of the drawbacks of the known techniques, an objective of the present invention is to provide a bundled flexible flat circuit cable having a stack structure, whereby the stack structure allows the flat cable to reduce a width dimension of an end of the flat cable so that the end of the flexible flat circuit cable can easily extend through a bore defined in a hinge.

Another objective of the present invention is to provide a bundled flexible flat circuit cable that exhibits excellent electromagnetic shielding characteristics, which when combined with the features of stacking and bundling of the flat cable of the present invention, allows for the formation of an electromagnetic shielding layer on a flexible substrate of the flat cable and may also allow for forming a bundled structure with electromagnetic shielding material.

The solution adopted in the present invention to overcome the problems of the conventional techniques comprises a flexible substrate that forms at least one cluster section. The cluster section is composed of plural cluster strips that are formed by slitting the flexible substrate along an extension direction of the flexible substrate. The cluster section has an end forming at least one first connection section and an opposite end forming at least one second connection section. Both the first and second connection sections or one of the first and second connection sections comprises a stack structure, which is formed by folding two opposite side stacking zones or one of the two opposite side stacking zones of the connection section along a respective fold line to have the side stacking zone stacked on at least a portion of a central zone of the connection section that is located between the two opposite side stacking zones.

In an embodiment of the present invention, the flexible substrate can be of a single-sided or double-sided structure and may additionally comprise an electromagnetic shielding layer. A bundling structure is provided to bundle the cluster section at a predetermined location to form a bundled structure. The bundling structure can be made of a shielding material, an insulation material, or a combination of shielding material and insulation material.

According to the present invention, a stacked arrangement is selectively formed so that the configuration of a signal transmission flat cable can be made to reduce the width dimension of an end of the flexible flat circuit cable. Thus, the sized reduced end of the flexible flat circuit cable can be easily extended through a small diameter of a bore defined in a hinge when the flexible flat circuit cable is being mounted to the hinge structure. The bundling structure that bundles the cluster section of the flexible flat circuit cable together provides a function to restrict flexing of each cluster strip of the cluster section of the flexible substrate and also offers electromagnetic shielding to the cluster section.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
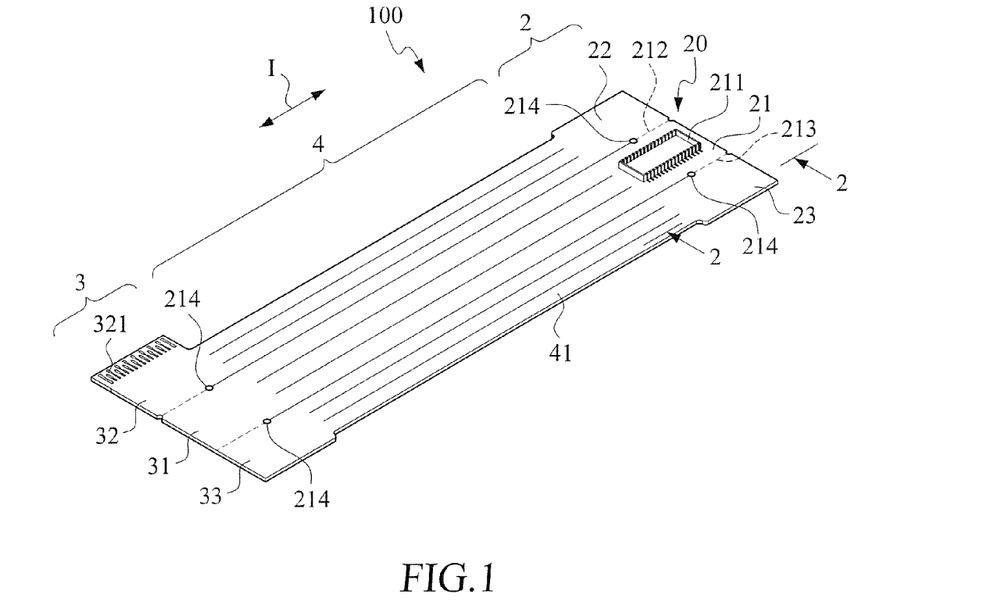
FIG. 1 is a perspective view of a bundled flexible flat circuit cable in accordance with the present invention in an expanded form.
Figure 2:
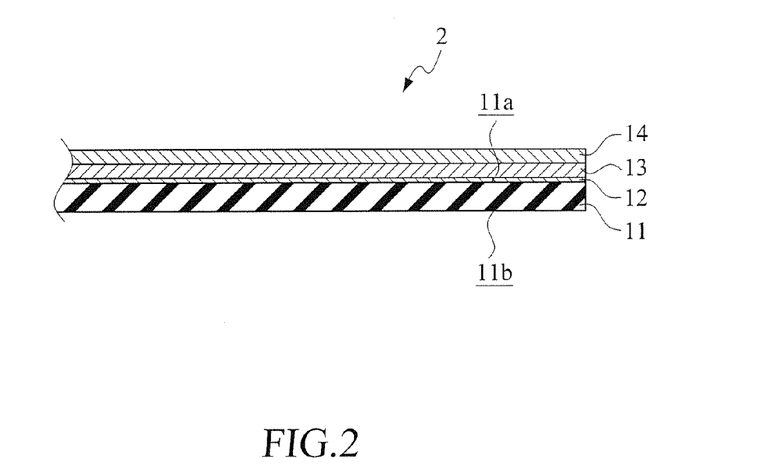
FIG. 2 is a cross-sectional view taken along line 2-2 of FIG. 1.

With reference to the drawings and in particular to FIG. 1, which shows a perspective view of a bundled flexible flat circuit cable in accordance with the present invention in an expanded form, and FIG. 2, which shows a cross-sectional view taken along line 2-2 of FIG. 1, the bundled flexible flat circuit cable constructed in accordance with the present invention, generally designated at 100, comprises a flexible substrate 11, which extends a predetermined length in an extension direction I. The flexible substrate 11 has a first surface 11a and an opposite second surface 11b. A first conductive layer 12 and a first insulation layer 13 are sequentially formed on the first surface 11a of the flexible substrate 11. In a preferred embodiment of the present invention, an electromagnetic shielding layer 14 is further formed on the first insulation layer 13. The electromagnetic shielding layer 14 may selectively and locally covers a predetermined area of an external surface of the first insulation layer 13 to provide electromagnetic shielding for protecting electrical signals.

Figure 3:
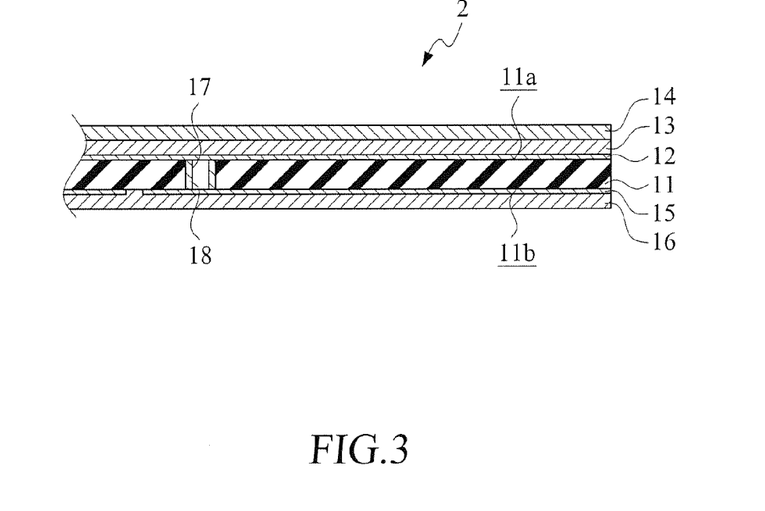
FIG. 3 is a cross-sectional view showing a flexible substrate arranged as a double-sided circuit substrate in accordance with the present invention.

The flexible circuit substrate shown in FIG. 2 has a structure of single-sided circuit substrate. However, the present invention is equally applicable to a double-sided circuit substrate. In a structure of double-sided circuit substrate (see FIG. 3), a second conductive layer 15 and a second insulation layer 16 are sequentially formed on the second surface 11b of the flexible substrate 11. Further, in the structure of double-sided circuit substrate, a signal jumper structure may be additionally provided. For example, a through hole 17 is defined through both the first surface 11a and the second surface 11b of the flexible substrate 11 at a predetermined location and a conductive substance 18 is formed on an inside surface of the through hole 17 to allow for selective signal communication between the first conductive layer 12 and the second conductive layer 15 of the first surface 11a and the second surface 11b of the flexible substrate 11. The structure of double-sided circuit substrate can be alternatively realized by bonding two single-sided circuit substrates in a back-to-back manner.

The flexible substrate 11 is divided in the extension direction I into a first connection section 2, a second connection section 3, and a cluster section 4 between the first and second connection sections 2, 3. In other words, the first connection section 2 is located at an end of the cluster section 4, while the second connection section 3 is located at an opposite end of the flexible substrate 11 that is opposite to the first connection section 2.

The cluster section 4 comprises a plurality of cluster strips 41 that is formed by slitting the flexible substrate 11 in the extension direction I. All or some of the cluster strips 41 is provided with a signal line to serve as an electrical signal transmission path between the first connection section 2 and the second connection section 3. The cluster section 4 may selectively form a plurality of tear stop holes 214 at suitable locations of terminals of all or some cluster strips 41 (for example, in the first connection section 2 and the second connection section 3) in order to protect the cluster strips 41 from damage caused by undesired tearing along the slitting during the assembling or use of the flexible substrate 11.

Figure 4:
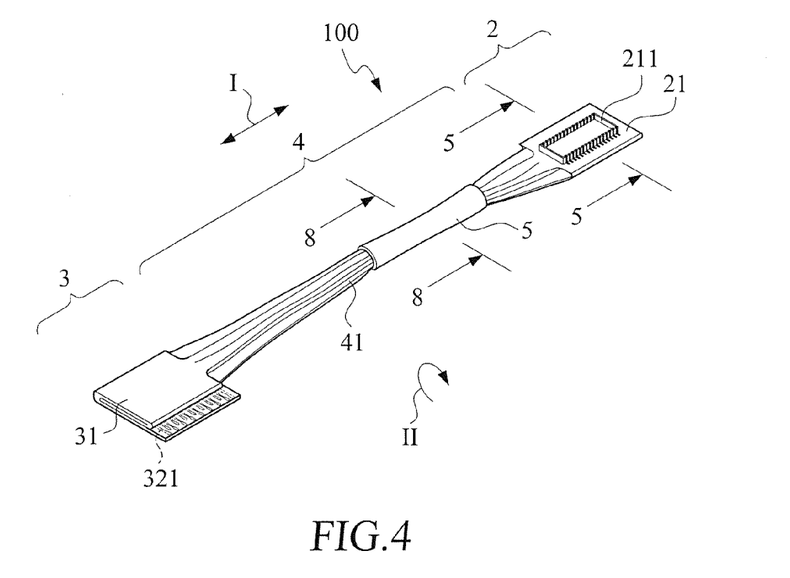
FIG. 4 is a perspective view showing the bundled flexible flat circuit cable of the present invention with terminal connection sections thereof in a stacked condition.
Figure 5:
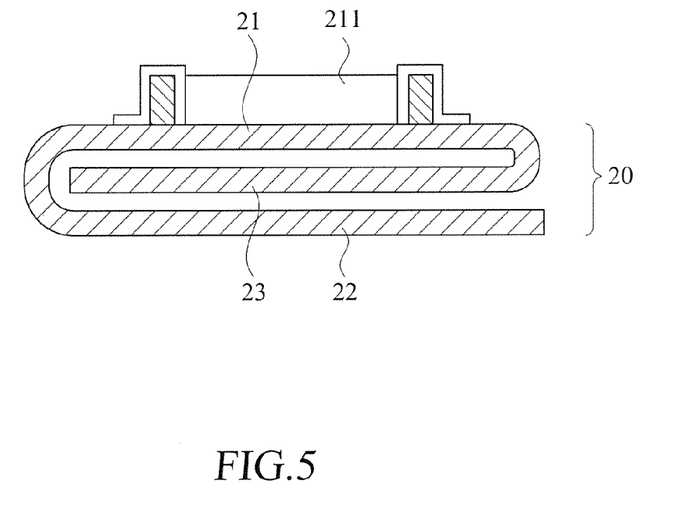
FIG. 5 is a cross-sectional view taken along line 5-5 of FIG. 4.

The first connection section 2 comprises a stack structure 20. With also reference to FIGS. 4 and 5, the stack structure 20 divides the first connection section 2 into a central zone 21 and side stacking zones 22, 23 located on opposite sides of the central zone 21. The side stacking zones 22, 23 of the two sides or one of the side stacking zones 22, 23 of one side of the central zone 21 is allowed to fold along a physical or imagination fold line 212, 213 to fold in a direction toward the central zone 21 so as to have the side stacking zones 22, 23 stacked under the central zone 21 or on a portion of the central zone 21. In this way, the width of the first connection section 2 that is a dimension measured in a direction perpendicular to the extension direction I of the flexible substrate 11 is reduced. The second connection section 3 may also be provided with a similar stack structure to allow two side stacking zones 32, 33 that are located on opposite sides of a central zone 31 of the second connection section 3 to be stacked under the central zone 31 or on a portion of the central zone 31. After the stacking operation, a structure shown in FIG. 4 is formed.

Figure 6:
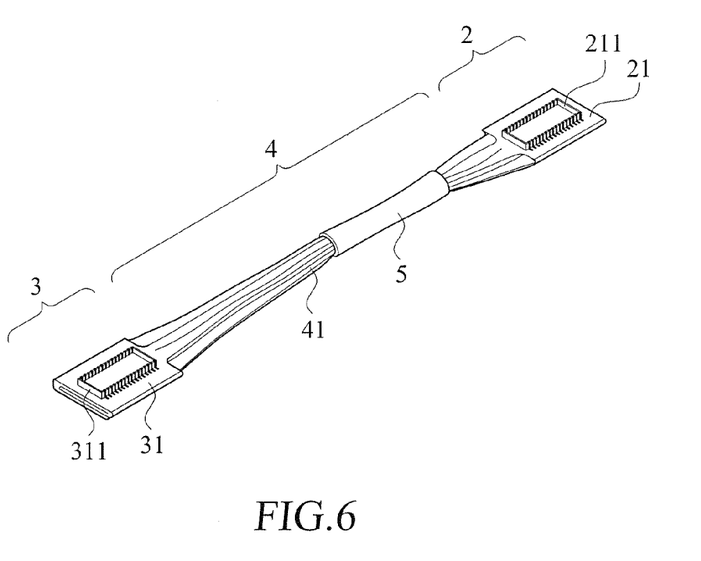
FIG. 6 is a perspective view showing an embodiment of the bundled flexible flat circuit cable of the present invention where both a first connection section and a second connection section are each provided with a connection socket.

In a practical application, the first connection section 2 and the second connection section 3 may be provided with different types of connection socket or terminal plug at predetermined locations thereof. For example, as shown in the embodiment of FIG. 1, a connection socket 211 is set on the central zone 21 of the first connection section 2, while the side stacking zone 32 of the second connection section 3 forms a terminal plug 321 at a side edge thereof. It is certainly and alternatively feasible to provide same type of connection socket or terminal plug at both the first connection section 2 and the second connection section 3. For example, as shown in the embodiment of FIG. 6, the central zone 21 of the first connection section 2 is mounted with a connection socket 211 and the side stacking zone 31 of the second connection section 3 is also provided with a connection socket 311.

Figure 7:
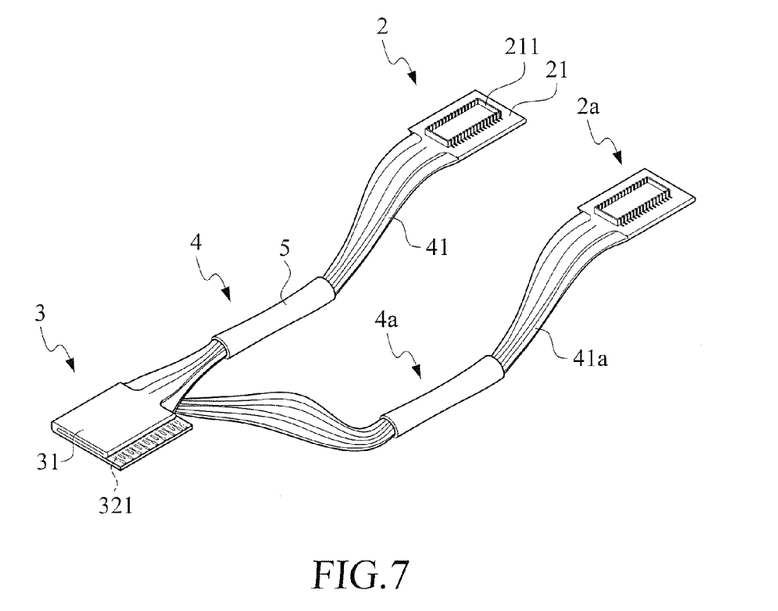
FIG. 7 is a perspective view showing an embodiment of the present invention where a connection section is connected respectively through cluster strips of two separate cluster sections to two opposite connection sections.

Further, the connection sections and the cluster section of the flexible substrate can be arranged in a one-to-one fashion, or alternatively a one-to-plurality fashion can be adopted. For example, in the embodiment of FIG. 1, an arrangement that a connection section is connected by a single cluster section to an opposite connection section is provided. However, in the embodiment of FIG. 7, a different arrangement that a second connection section 3 is connected by cluster strips 41 of a cluster section 4 to a first connection section 2 and is also connected by cluster strips 41a of an additional cluster section 4a to an additional first connection section 2a is provided. Practical application may need different variations to meet different requirements.

Figure 8:
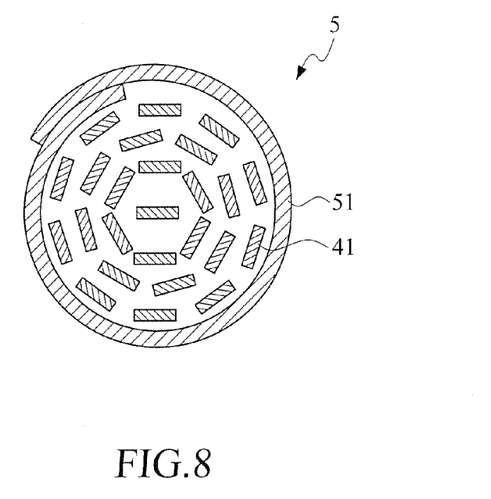
FIG. 8 is a cross-sectional view showing a bundling structure wrapping around cluster strips of a cluster section of a flexible substrate in accordance with the present invention.

In an embodiment of the present invention, at least one bundling structure 5 is provided to loop around or bundle the cluster section 4 of the flexible substrate 11 at a predetermined location (see FIG. 4) so as to bundle the cluster strips 41 of the cluster section 4 together to form a bundled structure. FIG. 8 shows a cross-sectional view taken along line 8-8 of FIG. 4. In a preferred embodiment of the present invention, the bundling structure 5 comprises an electromagnetic shielding layer 51. In other words, the bundling structure 5 comprises a structure that is made of an electromagnetic shielding substance looping around the predetermined location of the cluster section 4, so as to loop or bundle the cluster strips 41 of the cluster section 4 together to form a bundled structure and also to provide electromagnetic shielding to the cluster section 4. The bundling structure 5 can be alternatively made of an insulation material (such as a water-proof plastic band) or a composite combination of electromagnetic shielding substance and insulation material can be used to form the bundling structure.

Figure 9:
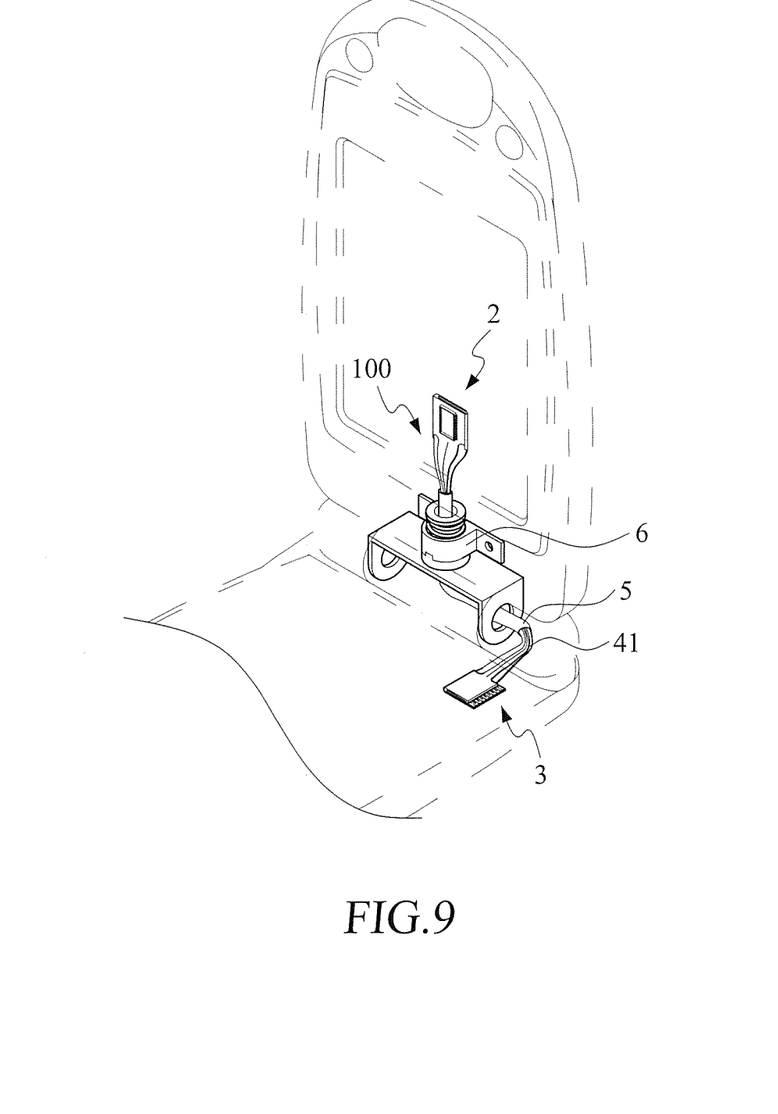
FIG. 9 is a perspective view showing an application of the present invention in a mobile phone that has a hinge structure.

FIG. 9 illustrates an example application of the present invention in a mobile phone that has a hinge structure. As shown, the bundled flexible flat circuit cable 100 is set through a hinge structure 6 with the cluster strips 41 of the cluster section 4 of the flexible substrate 11 and the first connection section 2 and the second connection section 3 are respectively set on opposite sides of the hinge structure 6. With the electromagnetic shielding effect provided by the electromagnetic shielding layer 51 of the bundling structure 5, electromagnetic interference occurring in the electrical signals transmitted through a transmission path defined by the cluster strips 41 of the cluster section 4 can be effectively eliminated.

Figure 10:
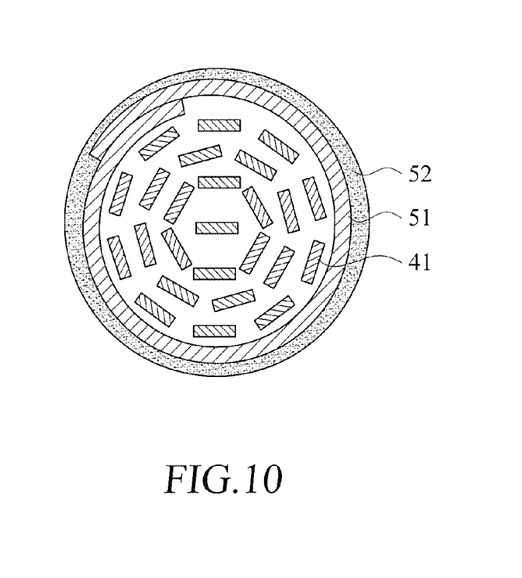
FIG. 10 is a cross-sectional view showing an outer insulation layer wrapping around an outer surface of an electromagnetic shielding layer of the bundling structure shown in FIG. 8.
Figure 11:
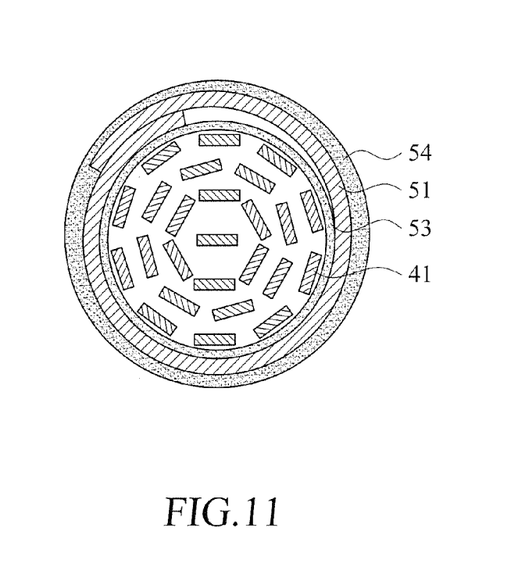
FIG. 11 is a cross-sectional view showing a cluster section of a flexible substrate of the present invention first wrapped by an inner insulation layer, an electromagnetic shielding layer wrapping around an outer surface of the inner insulation layer, and an outer insulation layer further wrapping around an outer surface of the electromagnetic shielding layer.

In an alternative application, an outer surface of the electromagnetic shielding layer 51 may be further surrounded by an outer insulation layer 52 (see FIG. 10), or alternatively, the cluster section 4 of the flexible substrate 11 is wrapped around by an inner insulation layer 53, an electromagnetic shielding layer 51 is then wrapped around an outer surface of the inner insulation layer 53, and finally an outer insulation layer 54 is further wrapped around an outer surface of the electromagnetic shielding layer 51 (see FIG. 11).

Figure 12:
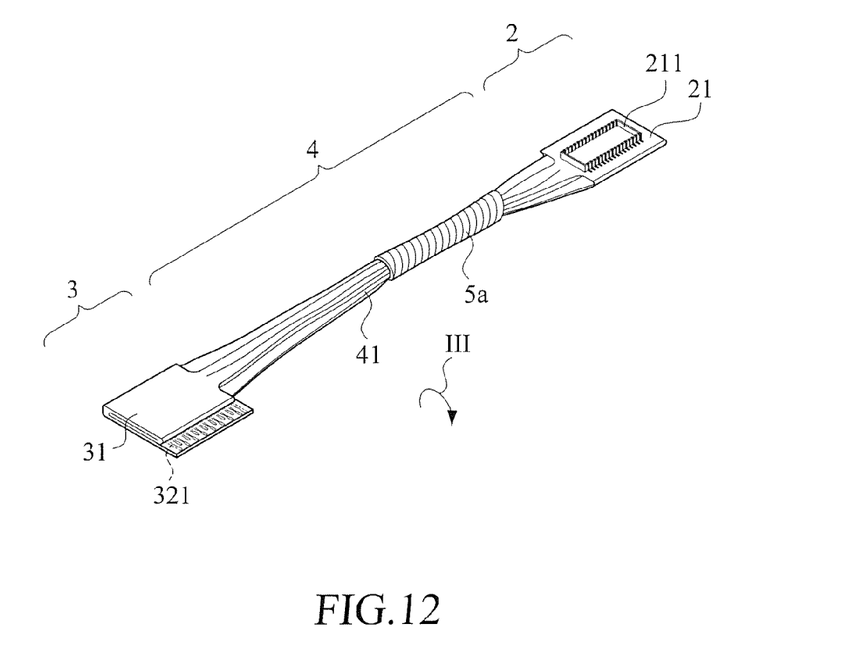
FIG. 12 is a perspective view showing a bundled flexible flat circuit cable in accordance with the present invention where a helical bundling structure wraps around a predetermine location of a cluster section of the bundled flexible flat circuit cable.

The bundling structure 5 used in the previous embodiments is made in the form of a thin sheet, which is wrapped in a wrapping direction II around the predetermined location of the cluster section. Alternatively, a helical wrapping structure may be employed to form the bundling structure. As shown in FIG. 12, a slender elongate band made of an electromagnetic shielding material is helically wrapped in an inclination direction III around the cluster strips 41 of the cluster section 4 to form a helical bundling structure 5a. The elongate band can be made of an electromagnetic shielding material including a piece of electrically conductive cloth, silver foil, aluminum foil, copper foil, and other metal foils that exhibit electromagnetic shielding characteristics.

Although the present invention has been described with reference to the preferred embodiments thereof, it is apparent to those skilled in the art that a variety of modifications and changes may be made without departing from the scope of the present invention which is intended to be defined by the appended claims.

What is claimed is:
1. A bundled flexible flat circuit cable, comprising:
a flexible substrate, which extends in an extension direction and has a first surface and a second surface;
a first conductive layer, which is formed on the first surface of the flexible substrate;
at least a first connection section, which is formed on an end of the flexible substrate;
at least a second connection section, which is formed on an opposite end of the flexible substrate that is opposite to the first connection section, said first and second connection sections, each defining a pair of tab members extending in a direction normal to said extension direction and positioned in overlying relation each to the other to expose an electrically conductive element;
at least a cluster section, which connects between the first connection section and the second connection section and comprises a plurality of cluster strips that are formed by slitting the flexible substrate in the extension direction;
a first insulation layer, which is formed on the first conductive layer; and
at least a bundling structure, which bundles the cluster section at a predetermined location to wrap the cluster strips of the cluster section together to form a bundled structure, the bundling structure comprising an electromagnetic shielding layer wrapping around the cluster section;
wherein the bundling structure further comprises an outer insulation layer wrapping around the electromagnetic shielding layer.

2. The bundled flexible flat circuit cable as claimed in claim 1, wherein the first connection section having said electrically conductive element, said electrically conductive element comprises one of a terminal plug and a connection socket formed thereon, said terminal plug extending from one of said tab members.

3. The bundled flexible flat circuit cable as claimed in claim 1, wherein the second connection section having said electrically conductive element, said electrically conductive element comprises one of a terminal plug and a connection socket formed thereon, said terminal plug extending from one of said tab members.

4. The bundled flexible flat circuit cable as claimed in claim 1, further comprising an electromagnetic shielding layer on the first insulation layer of the flexible substrate.

5. The bundled flexible flat circuit cable as claimed in claim 1, further comprising:
a second conductive layer, which is formed on the second surface of the flexible substrate; and
a second insulation layer, which is formed on the second conductive layer.

6. The bundled flexible flat circuit cable as claimed in claim 5, further comprising an electromagnetic shielding layer on at least one of the first insulation layer and the second insulation layer.

7. The bundled flexible flat circuit cable as claimed in claim 1, wherein the bundling structure further comprises an inner insulation layer between the cluster section and the electromagnetic shielding layer.

* * * * *